(12) United States Patent
Fenske (10) Patent No.: US 6,734,662 B1
(45) Date of Patent: May 11, 2004

(54) MICROPROCESSOR CONTROLLED FAULT INDICATOR HAVING LED FAULT INDICATION CIRCUIT WITH BATTERY CONSERVATION MODE

(75) Inventor: Kurt James Fenske, Gleason, WI (US)

(73) Assignee: E.O. Schweitzer Manufacturing Co., Inc., Mundelein, IL (US)

( * ) Notice: Subject to any disclaimer, the term of this patent is extended or adjusted under 35 U.S.C. 154(b) by 0 days.

(21) Appl. No.: 10/280,219

(22) Filed: Oct. 25, 2002

Related U.S. Application Data
(60) Provisional application No. 60/337,631, filed on Oct. 26, 2001.

(51) Int. Cl.$^7$ .............................................. G01R 19/14
(52) U.S. Cl. ........................ 324/127; 324/133; 340/664
(58) Field of Search ................................. 324/126, 127, 324/133, 512, 522; 340/660, 661, 662, 663, 664

(56) References Cited

U.S. PATENT DOCUMENTS

| | | | |
|---|---|---|---|
| 3,676,740 A | * 7/1972 | Schweitzer, Jr. | 361/74 |
| 3,906,477 A | * 9/1975 | Schweitzer, Jr. | 324/133 |
| 4,063,171 A | * 12/1977 | Schweitzer, Jr. | 324/133 |
| 4,234,847 A | * 11/1980 | Schweitzer | 324/146 |
| 4,375,617 A | * 3/1983 | Schweitzer, Jr. | 324/133 |
| 4,438,403 A | * 3/1984 | Schweitzer, Jr. | 324/133 |
| 4,456,873 A | * 6/1984 | Schweitzer, Jr. | 324/543 |
| 4,458,198 A | * 7/1984 | Schweitzer, Jr. | 324/133 |
| 4,495,489 A | * 1/1985 | Schweitzer, Jr. | 340/664 |
| 4,974,329 A | * 12/1990 | Willa | 33/391 |
| 5,677,678 A | * 10/1997 | Schweitzer, Jr. | 340/664 |
| 6,016,105 A | * 1/2000 | Schweitzer, Jr. | 340/664 |
| 6,133,723 A | * 10/2000 | Feight | 324/133 |
| 6,133,724 A | * 10/2000 | Schweitzer, Jr. et al. | 324/133 |

* cited by examiner

Primary Examiner—Vinh P Nguyen
(74) Attorney, Agent, or Firm—Cook, Alex, McFarron, Manzo, Cummings & Mehler, Ltd.

(57) ABSTRACT

A fault indicator for indicating the occurrence of a fault in an electrical conductor has a housing, a high capacity battery, at least one light emitting diode (LED) visible from the exterior of the fault indicator upon the occurrence of a fault, and electronic circuitry for sensing a fault, for actuating the LEDs to indicate a fault and to provide a timed reset of the LEDs to a non-fault indicating condition a predetermined time after the fault has occurred. The electronic circuitry, including a microprocessor that is normally in a sleep mode, conserves energy by drawing insubstantial current from a high capacity battery during non-fault conditions. During fault conditions, a light sensor senses the ambient lighting conditions and the microprocessor reduces current supplied to the LEDs under reduced lighting levels, such as night, further conserving battery life. The LEDs may also be operated at an intermediate illumination level, such as at dusk or dawn.

17 Claims, 7 Drawing Sheets

MICROPROCESSOR CONTROLLED FAULT INDICATOR HAVING LED FAULT INDICATION CIRCUIT WITH BATTERY CONSERVATION MODE

CROSS-REFERENCE TO RELATED APPLICATIONS

This patent application is a non-provisional application of U.S. provisional patent application Serial No. 60/337,631 filed on Oct. 26, 2001. This patent application is also related to the following non-provisional patent applications filed concurrently herewith: Microprocessor Controlled Fault Indicator with Battery Conservation Mode, Ser. No. 10/280,322; Microprocessor Fault Indicator Having High Visibility LED Fault Indication, Ser. No. 10/280,141; Microprocessor Controlled Fault Indicator Having Inrush Restraint Circuit, Ser. No. 10/280,329; Microprocessor Controlled Directional Fault Indicator, Ser. No. 10/280,195; and Microprocessor Controlled Fault Indicator with Circuit Overload Condition Detection, Ser. No. 10/280,328; all filed on Oct. 25, 2002, and all incorporated by reference herein, in their entireties.

BACKGROUND OF THE INVENTION

The present invention relates generally to current sensing devices for electrical systems, and more particularly to timed reset fault indicators for alternating current power systems.

Various types of self-powered fault indicators have been constructed for detecting electrical faults in power distribution systems, including clamp-on type fault indicators, which clamp directly over cables in the systems and derive their operating power from inductive and/or capacitive coupling to the monitored conductor; and test point type fault indicators, which are mounted over test points on cables or associated connectors of the systems and derive their operating power from capacitive coupling to the monitored conductor.

Such fault indicators may be either of the manually resetting type, wherein it is necessary that the indicators be physically reset, or of the self-resetting type, wherein the indicators are reset upon restoration of line current. Examples of such fault indicators are found in products manufactured by E. O. Schweitzer Manufacturing Company of Mundelein, Ill., and in U.S. Pat. Nos. 3,676,740, 3,906,477, 4,063,171, 4,234,847, 4,375,617, 4,438,403, 4,456,873, 4,458,198, 4,495,489, 4,974,329, 5,677,678, 6,016,105, 6,133,723 and 6,133,724.

Detection of fault currents in a monitored conductor by a fault indicator is typically accomplished by magnetic switch means, such as a magnetic reed switch, in close proximity to the conductor being monitored. Upon occurrence of an abnormally high fault-associated magnetic field around the conductor, the magnetic switch actuates a trip circuit that produces current flow in a trip winding to position an indicator flag visible from the exterior of the indicator to a trip or fault indicating position. Upon restoration of current in the conductor, a reset circuit is actuated to produce current flow in a reset winding to reposition the target indicator to a reset or non-fault indicating position, or the fault indicator may be manually reset.

Some prior art fault indicators utilize light emitting diodes (LEDs) to display a fault condition. However, activation of LEDs requires a source of power greater than that typically obtainable from inductive or capacitive coupling to a monitored conductor, such as from an internal battery. Even if the LEDs are controlled to flash intermittently, the intermittent current drain from the internal battery is not insubstantial, and replacement of the battery is sometimes required. There is therefore a need to operate the LEDs at reduced current levels especially at nighttime.

There is therefore a need for a battery-powered fault indicator with an energy conservation mode in which there is insubstantial current drain from a high capacity battery, such that the battery may never need replacement. There is also a need for a battery-powered fault indicator with circuitry, including a microprocessor, which places insubstantial current drain on the battery until a fault is detected. There is a further need for such a fault indicator that returns to the energy conservation mode when the fault condition is corrected or when the fault indicator is reset.

In certain other applications, the need arises for a fault indicator that will continue to display a prior fault condition for a predetermined amount of time, such as in the range of one hour to twenty-four hours, rather than self-resetting upon restoration of current in the conductor. Such timed reset fault indicators should be capable of self-resetting after termination of the predetermined time.

Some of these applications also require voltage in-rush restraint and/or current in-rush restraint to prevent false tripping due to voltage and/or current surges, such as when a reclosing relay of a power distribution system closes.

Because of the compact construction and limited power available in self-powered fault indicators, it is preferable that the desired functions of the fault indicator be accomplished with minimal structure and with internal circuitry that has minimal current drain on a high capacity battery. The fault indicator must also provide highly reliable and extended operation over a number of years.

Accordingly, it is a general object of the present invention to provide a new and improved fault indicator with internal circuitry having insubstantial current drain on the battery during non-fault conditions such that the battery may never need replacement during the expected lifetime of the fault indicator.

Another object of the present invention is to provide a fault indicator that is microprocessor-controlled, with the microprocessor operating in a sleep mode during non-fault conditions to conserve battery life.

Yet another object of the present invention is to provide a fault indicator with highly visible LED indicators that are periodically illuminated for a predetermined amount of time after sensing a fault on a monitored conductor.

A further object of the present invention is to sense the ambient lighting conditions and to reduce the current supplied to the LEDs under lower ambient light levels, such as at night, to further reduce current drain on the battery and thereby conserve battery life.

Another object of the present invention is to control the amount of power supplied to the indicator LEDs by means of pulse width modulated signals for a predetermined period of time, followed by a longer off time for the LEDs, thereby further conserving battery power.

A still further object of the present invention is to provide a battery-powered fault indicator that functions in a non-fault mode with insubstantial current drain from the battery, and that functions in the fault mode with energy conservation techniques, such that the battery may last the expected lifetime of the fault indicator.

SUMMARY OF THE INVENTION

This invention is directed to a fault indicator for indicating the occurrence of a fault current in an electrical conductor. The fault indicator has a housing, a high capacity battery, at least one light emitting diode (LED) visible from the exterior of the fault indicator upon the occurrence of a fault, and electronic circuitry for sensing a fault, for actuating the LEDs to indicate a fault and for automatically resetting the LEDs to a non-fault indicating condition a predetermined time after the fault has occurred. The electronic circuitry conserves energy by drawing insubstantial current from the high capacity battery during non-fault conditions such that the battery may never need replacement during the expected lifetime of the fault indicator. The electronic circuitry includes a microprocessor that operates in a sleep mode during non-fault conditions to further reduce current drain. A light sensor senses the ambient lighting conditions and the microprocessor reduces current supplied to the LEDs under reduced light levels, such as night, to further reduce current drain on the battery and to conserve battery life. An intermediate lighting level for the fault indicating LEDs may be provided for intermediate lighting levels, such as at dusk, dawn or on an overcast day. Fault indicating LEDs then operate at an intermediate current level between the higher daytime level and the lower nighttime level.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures in which like reference numerals identify like elements, and in which:

DESCRIPTION OF THE PREFERRED EMBODIMENT

Figures 1, 2, 3:
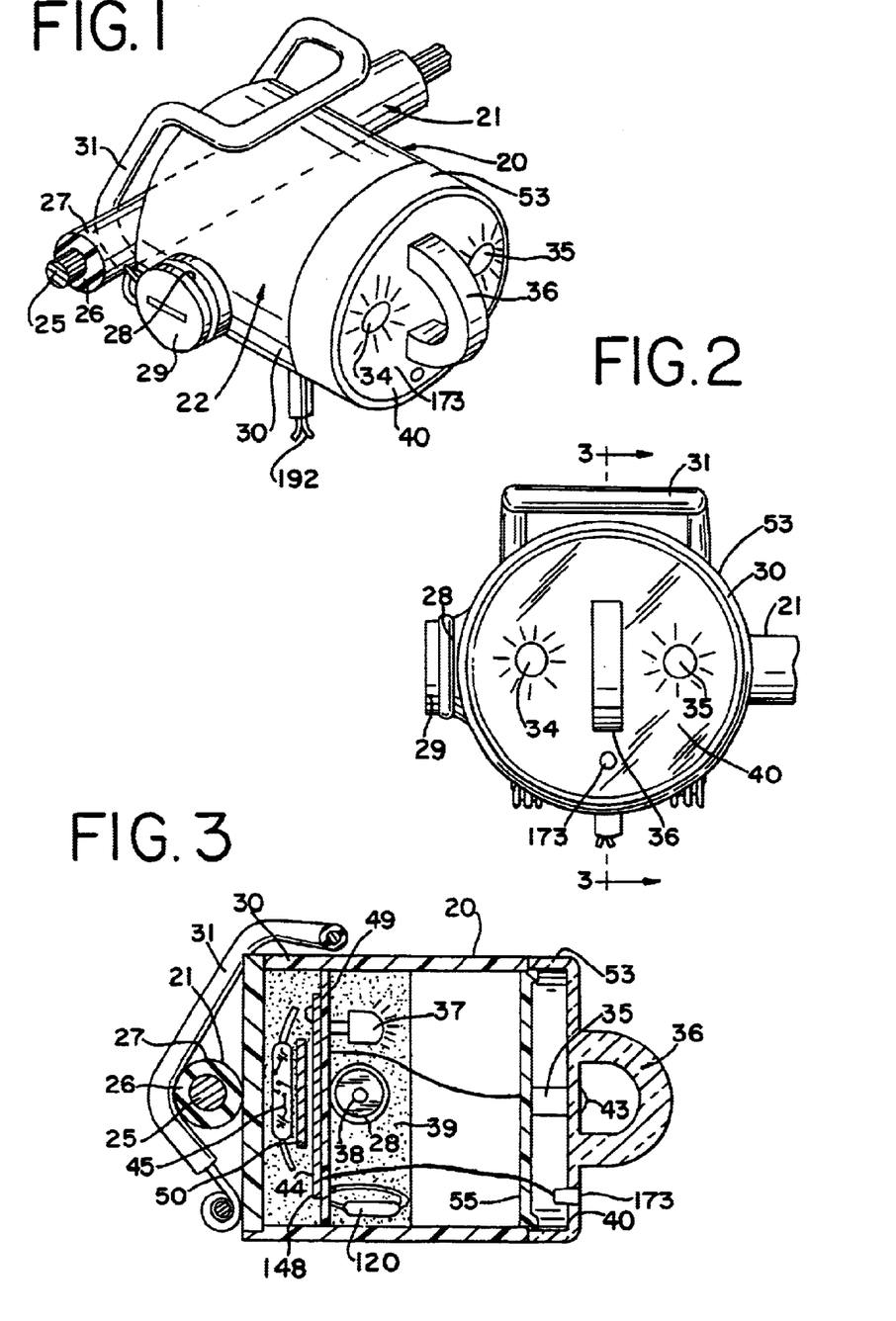
FIG. 1 is a perspective view of an electric field powered clamp-on fault indicator with provision for external battery replacement that is constructed in accordance with the present invention and that may be installed on a cable within a power distribution system.
FIG. 2 is a front view of the fault indicator of FIG. 1 showing illuminated LEDs to indicate the occurrence of a fault.
FIG. 3 is a cross-sectional view of the fault indicator of FIGS. 1 and 2 taken along the sectional line 3—3 of FIG. 2.

Referring to the Figures, and particularly FIG. 1, a clamp-on timed reset fault indicator, generally designated 20, is constructed in accordance with the invention. Fault indicator 20 indicates fault currents in an electrical feeder or distribution cable, generally designated 21, and includes a circuit module, generally designated 22. In accordance with conventional practice, circuit module 22 is attached to the outer surface of the cable 21, which may include a central conductor 25, a concentric insulating layer 26 and an electrically grounded rubber outer sheath 27.

Circuit module 22 includes a housing 30 (FIG. 2) that contains electronic circuitry for sensing and responding to fault currents in cable 21. A clamp assembly 31 attaches the module to a monitored conductor, such as cable 21, and holds cable 21 in close proximity to the electronic circuitry such that at least a portion of the power for the electronic circuitry is derived from the electric field of cable 21. The structure and operation of this circuitry is discussed below. An eye 36 on an end cap 53 may be provided to allow use of a conventional hotstick during installation or removal of fault indicator 20 about cable 21. When installed on an overhead cable, fault indicator 21 normally hangs downwardly such that a face 40 containing the status indicators 34 and 35 is easily viewed from the ground by service personnel or the like.

Housing 30 and end cap 53 may be formed from any suitable material, such as plastic. End cap 53 forms part of the housing 30, and may be sonically welded to housing 30 to seal the interior of fault indicator 20 against contamination. A battery holder 28 within housing 30 includes a removable end cap 29, which provides access to a cylindrical battery compartment within which a battery 38 (FIG. 3) is contained. In this example, battery 38 may be one or more type AA lithium thionyl chloride cells that have about 2.4 ampere-hours of capacity and that are commercially available from Tadiran, Ltd. of Israel.

Circuit module 22 also includes status indicators in the form a pair of LEDs 34 and 35 to indicate whether a fault has occurred on cable 21. In operation, during normal current flow through conductor 21, LEDs 34 and 35 are normally off and not illuminated. Upon occurrence of a fault in a monitored conductor, LEDs 34 and 35 are illuminated by electronic circuitry, which is discussed in further detail below. For best viewing from different angles of view, LEDs 34 and 35 are at least flush with the exterior surface of end cap 53, and may project slightly above the top surface 40 of the end cap, or end cap 53 may be provided with convex lenses 43 to provide illumination in about a 180 degree field of view for better viewing by service personnel. LEDs 34 and 35 may be selected from any color commercially available. However, a color commonly associated with a fault, such as red, is preferred.

With reference to FIG. 3, a partition 55 may be integral to housing 30 for supporting the status indicator LEDs 34 and 35 and for better sealing of the interior of fault indicator 20. End cap 53 is preferably of a contrasting color to LEDs 34 and 35, such as dark blue, for better visibility of the LEDs.

A light sensor 173 may be disposed on the face 40 of fault indicator 20 to sense ambient light levels. As further discussed below, light sensor 173 may influence the intensity of light provided by LEDs 34 and 35 under differing ambient light conditions.

A pigtail 192 may provide signals relating to the operational status of fault indicator 20, such as to a remote location, for remotely monitoring an electrical distribution system or for automation purposes.

A third LED 37 may be disposed internally in housing 30, such as in the potting compound 39 that encases most of the electronic circuitry. Third LED 37 becomes illuminated during a fault condition when the light sensor 44 also senses a low ambient lighting level, such as that at nighttime. The objective is to make housing 30 glow in the dark after a sensed fault condition for better visibility. To this end, potting compound 39 is preferably clear and housing 30 is preferably formed from translucent plastic. Of course, other combinations of materials may be selected to achieve similar results, such as translucent potting compound 39 with a clear or translucent housing 30. When third LED 37 is illuminated after sensing a fault condition at reduced ambient light levels, LEDs 34 and 35 are also preferably illuminated to indicate the fault condition at the face 40 of fault indicator 20.

Figures 4, 5, 6:
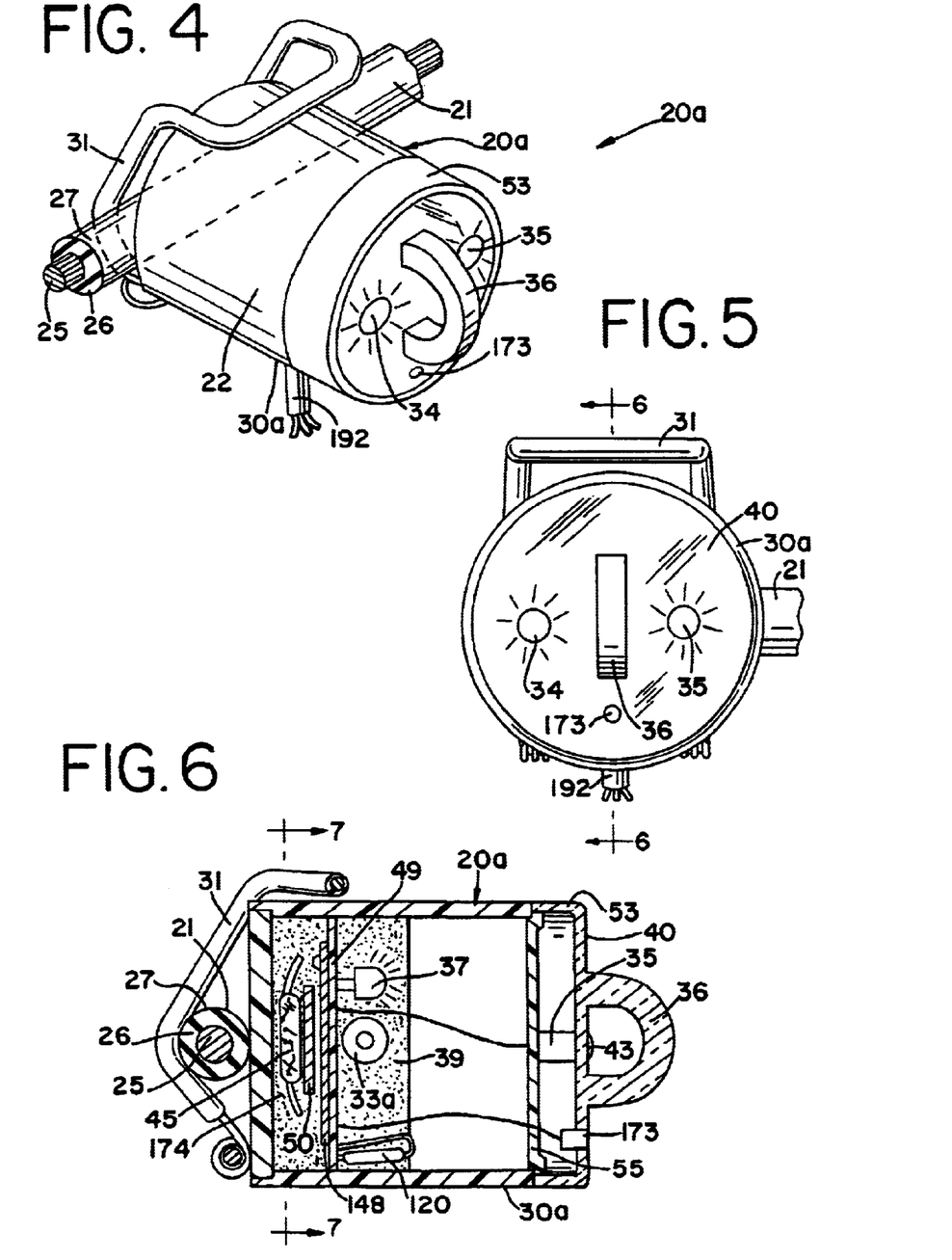
FIG. 4 is a perspective view of an alternate embodiment of the electric field powered fault indicator shown in FIGS. 1–3 constructed in accordance with the present invention and installed on a cable within a power distribution system, but with an internal non-replaceable battery.
FIG. 5 is a front view of the fault indicator of FIG. 4 showing illuminated LEDs to indicate the occurrence of a fault.
FIG. 6 is a cross-sectional view of the fault indicator of FIGS. 4 and 5 taken along the section line 6—6 of FIG. 5.

FIGS. 4–6 illustrate a fault indicator 20a, which is an alternate embodiment of fault indicator 20 shown in FIGS. 1–3. A primary difference between fault indicators 20 and 20a is that fault indicator 20a in FIGS. 4–6 is not equipped with a battery that is externally replaceable. Thus, housing 30a does not have a battery compartment 28 with a removable cap 29. Instead, a permanent and high-capacity battery 38a is potted in potting compound 39 at the time of manufacture. Since fault indicator 20a consumes battery current mostly during a fault condition, as will be understood more fully below, permanent battery 38a can be expected to last for the lifetime of fault indicator 20a, such as 10 or more years. Battery 38a is preferably a lithium thionyl chloride battery, such as type TL-593-S manufactured by Tadiran, Ltd. of Israel, which provides a constant 3.6 volt output to depletion. This battery has a nominal capacity rating of 8.5 ampere-hours.

Figure 11:
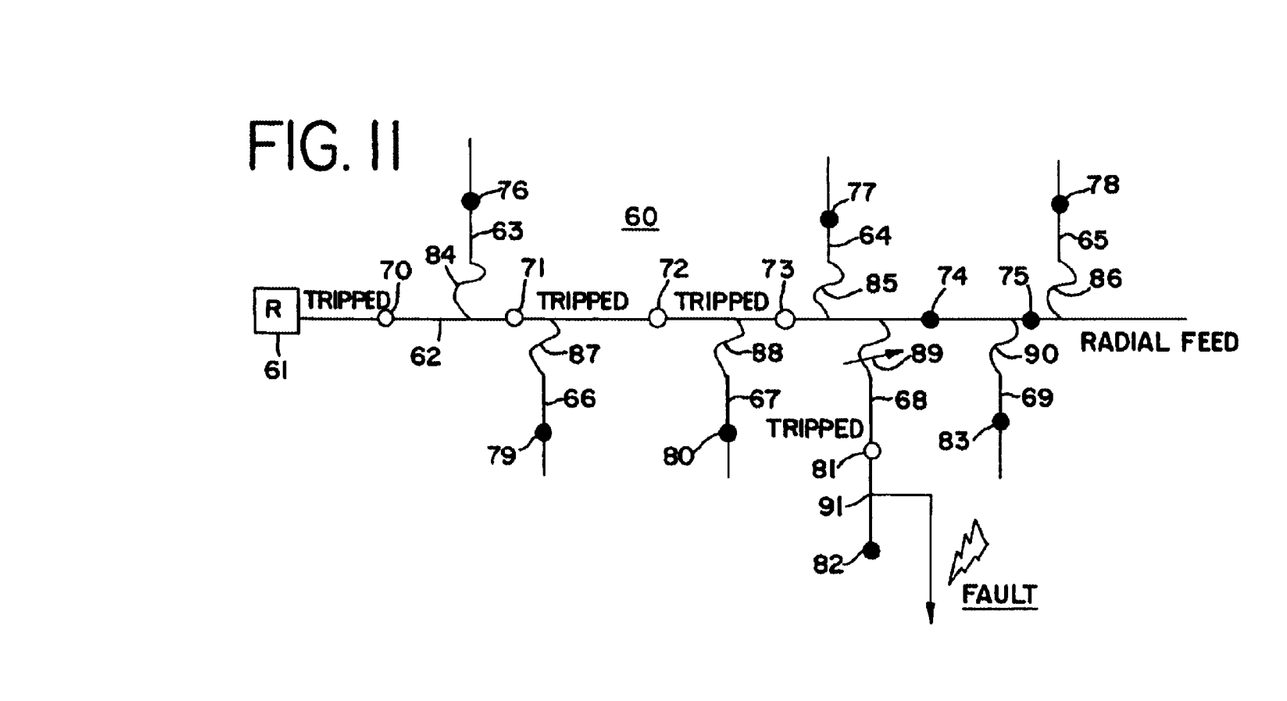
FIG. 11 is a diagrammatic illustration of an electrical distribution system employing a plurality of fault indicators to assist in locating a fault on the system.

In order to better understand some of the aspects of the present invention, the application of fault indicators 20 and 20a (hereinafter collectively referred to as fault indicator 20 unless otherwise noted) in an electrical distribution system will now be considered. Turning now to FIG. 11, a portion of an electrical distribution system, generally designated 60, is controlled by a reclosing relay 61. Electrical distribution system 60 may be of the radial feed type including a main line 62 and a plurality of radial lines 63–69. Main line 62 is typically a higher voltage overhead line. Radial lines 63–69 are typically lower voltage underground lines used in residential applications. For example, lines 63–69 often surface from their underground location at transformers in pad mounted enclosures. A plurality of fault indicators 70–82 is employed on the main and radial lines to assist in any fault that may occur on the system 60. If fault indicators are located on the main line between each radial feed line and on each radial feed line, the fault can be located by following the tripped or fault-indicating indicators 70–82.

In the example of FIG. 11, the tripped fault indicators 70–73 and 81 are shown with white centers. The untripped or reset fault indicators are shown with black centers. The system 60 also employs a plurality of fuses 84–90; one for each of the radial lines 63–69. In this example, a fault at a point 91, such as to ground, in line 68 is easily isolated by a lineman following the tripped fault indicators 70–73 and 81 as being between tripped fault indicator 81 and untripped fault indicator 82. Note that the fault at point 91 has also caused fuse 89 to blow or open.

Reclosing relays, such as relay 61, attempt to restore power to the distribution system 60 after a predetermined time, such as about 240 milliseconds (ms). Relay 61 may close for about 300 ms, and if the fault persists, relay 61 will again reopen for another 240 ms. If the fault remains after about three reclosing attempts, the relay 61 will remain in an open or locked out condition. In the example of FIG. 11, the relay 61 is likely to succeed in the first reclosing attempt because the blown fuse 89 now electrically isolates line 68, including the fault at point 91, from the remainder of the distribution system 60.

However, if fault indicators 70–73 are of the type that automatically reset upon the restoration of line current, fault indicators 70–73 will be reset before a lineman can view these fault indicators. Thus, fault indicators 70–73 will not assist in quickly isolating the fault on the system 60. Instead, the lineman will have to try to find tripped fault indicator 81 and/or blown fuse 89. It will of course be appreciated that the fault indicators 70–83 are positioned at physically disparate locations on the lines 62–69 of the system 60 such that individual review of each fault indicator may be time consuming and inefficient.

Fault indicator 20 has a timed reset to reset some hours after a fault occurs. Thus, in the example of FIG. 11, fault indicators 70–73 continue to display the fault by periodically illuminating LEDs 34 and 35, and LED 37 at nighttime if implemented, after reclosing relay 61 restores current to main line 62. This enables a lineman to easily trace the fault by following fault indicators 70 through 73 and 81 to a section of the line between fault indicators 81 and 82. The point of the fault 91 may then be located and repaired, or line 68 may be replaced. As will be understood hereinafter, the length of the timed reset may be in the range of 1 to 24 or more hours, and is preferably about 4 hours. Four hours normally provides sufficient time for a lineman or repair crew to review the tripped fault indicators to determine the part of the distribution system that has caused the fault.

Rather than waiting for the predetermined reset time to elapse, fault indicator 20 may be manually reset at any time. To this end, a reset magnetic reed switch 120 is disposed in the housing 30 or 30a in FIG. 3 or 6, preferably at a generally perpendicular angle to conductor 21. Magnetic reed switch 120 may be manually closed with a permanent magnet tool in a manner known to the art.

Figure 12:
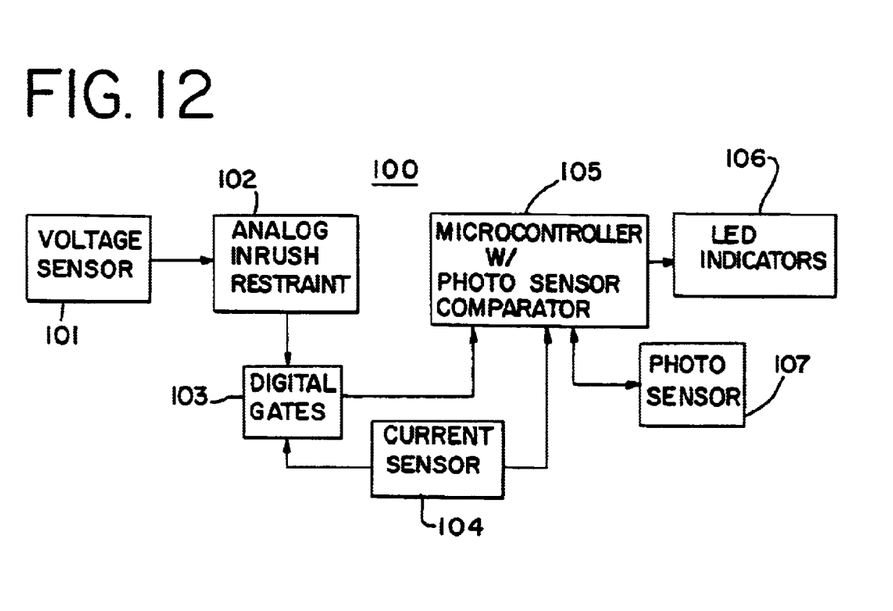
FIG. 12 is a block diagram of the electronic circuitry used in the fault indicators of FIGS. 1–7 showing the functions and interrelationships of the various circuit portions.

Turning now to FIG. 12, the electronic circuitry, generally designated 100, for fault indicator 20 is shown in block diagram form. A voltage sensor 101 provides operating power for an analog inrush restraint circuit 102. Voltage sensor 101 may take the form of an electrostatic assembly 145 shown in FIGS. 7 and 10. Electrostatic assembly 145 may include a generally rectangular and flat metallic plate 50 overlying an insulating substrate 148 with a pair of metal electrodes 146 and 147 thereon (FIG. 8). For example, metallic plate 50 may be spaced apart from substrate 148 by small insulating spacers 48 (FIG. 10) so that good electrostatic coupling exists between metal plate 50 and electrodes 146 and 147. For example, the distance between plate 50 and substrate 148 may be about 2 to 5 mm.

Substrate 148 with the electrodes 146 and 147 thereon may be fabricated by any suitable means, including printed circuit board techniques, deposition of metal on a ceramic substrate or by physically adhering metal foil onto a phenolic base. For example, the electrodes 146 and 147 may be a copper-nickel alloy foil about 10 to 12 thousandths of an inch (0.25 to 0.30 mm) thick. Metallic plate 50 is preferably provided with one or more apertures, such as 149 and 150 for good flow of a potting compound in and about the electrostatic assembly. For example, a urethane-based potting compound may be used, such as that commercially available under the BIWAX brand from the Biwax Corporation of Des Plaines, Ill. BIWAX is a registered trademark owned by the Biwax Corporation.

With reference to FIGS. 3 and 6, the entire housing 30 or 30a which houses a magnetic reed switch 45, a magnetic reed switch 120, electrostatic pickup plate 50 and substrate 148, battery 38 or 38a, third LED 37 and a circuit board 49 may be potted with the potting compound, or any portion thereof.

As seen in FIG. 8, electrodes 146 and 147 are preferably of different area such that differences in charge on electrodes 146 and 147 will develop a differential electrical signal between electrodes 146 and 147. For example, the area of electrode 146 may be about 15 to 75 percent of the area of electrode 147, and is preferably about 25 to 50 percent of the area of electrode 147.

Figure 8:
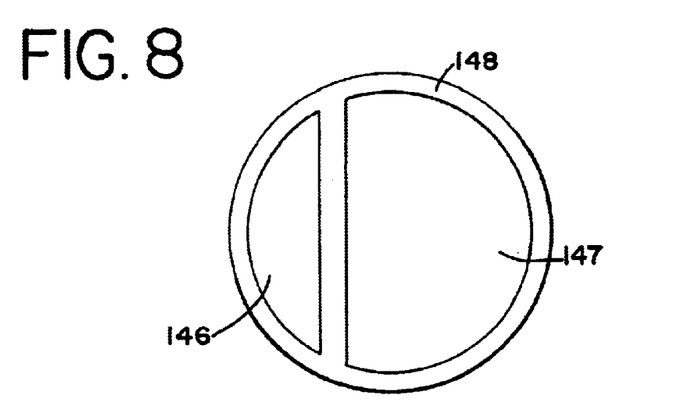
FIG. 8 is a plan view of a first embodiment of an electrostatic plate for the electrostatic pickup shown in FIG. 7.
Figure 9:
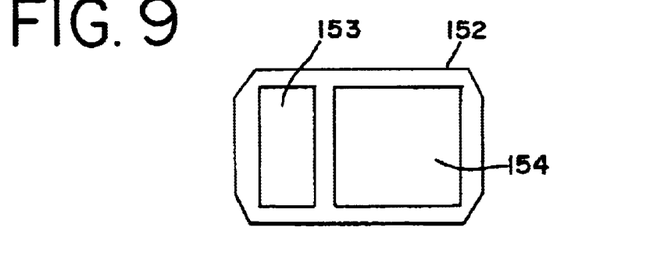
FIG. 9 is a plan view of a second embodiment of an electrostatic plate for the electrostatic pickup shown in FIG. 7.

Illustrated in FIG. 9 is an alternative embodiment of the substrate 148 in FIG. 8. In this embodiment, substrate 152 of insulating material may be of the same approximate rectangular configuration as metal plate 50. Generally rectangular metallic electrodes 153 and 154 are deposited on or adhered to the substrate 152, in a manner similar to substrate 148. Electrode 154 is of greater area than electrode 153 for the same reasons and same purpose as electrodes 146 and 146 in FIG. 8. For example, electrode 153 may be about 15 to 75 percent of the area of electrode 154, and is preferably about 25 to 50 percent of the area of electrode 154.

Figure 7:
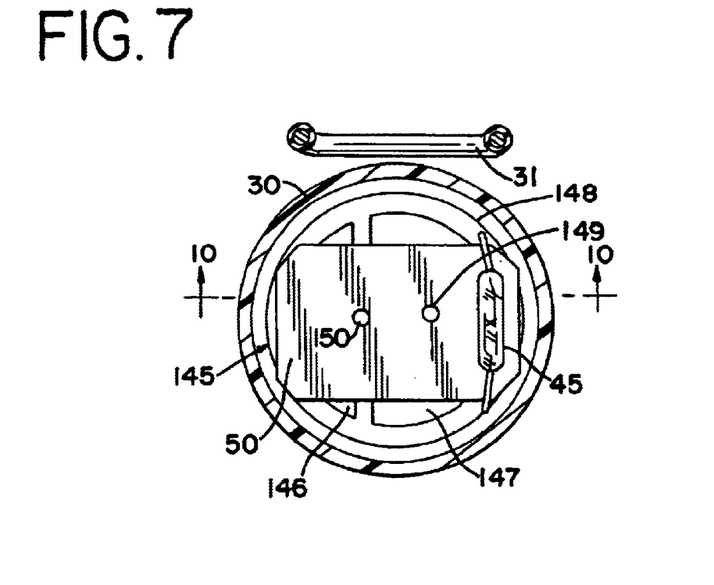
FIG. 7 is a cross-sectional view of the fault indicator of FIGS. 4–6 taken along the section line 7—7 of FIG. 6 to better illustrate an electrostatic pickup for deriving power from the electromagnetic field around the conductor of the power distribution system, and to supply operating power to portions of the electronic circuitry in the fault indicators shown in FIGS. 1–6.
Figure 10:
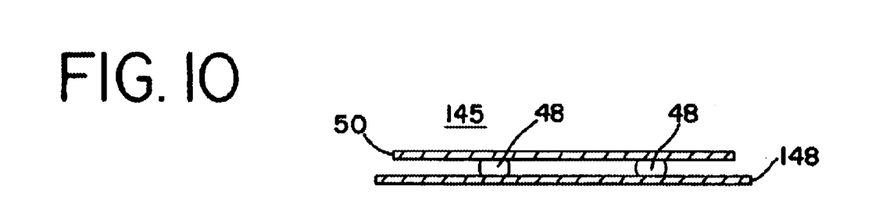
FIG. 10 is a cross-sectional view of the electrostatic pickup illustrated in FIG. 7 taken along section line 10—10.

Electrostatic assembly 145 in FIGS. 7 and 10 provides excellent immunity to stray electrical fields from adjacent electrical conductors in an electrical distribution system. For example, when the electrostatic pick up portions are physically separated, such as the plate 50 and the conductive band 51 shown in FIG. 3 of U.S. Pat. No. 6,016,105, the separate electrostatic pick up components may cause false triggering upon voltage in-rush in an adjacent conductor, instead of in the monitored conductor. Electrostatic assembly 145 of the present invention substantially avoids these unwanted stray effects and false triggering with the above-described dual electrodes of unequal area disposed on a single substrate 148 or 152.

Returning now to FIG. 12, analog inrush restraint circuit 102 receives a voltage signal from voltage sensor 101. Analog inrush restraint circuit 102 analyzes this voltage signal for any voltage inrush condition and also uses this voltage signal for powering the inrush restraint circuit. This also saves current drain on battery 38 or 38a. Analog inrush restraint circuit 102 supplies an output signal to digital gates 103 which interface the analog output signal to a microprocessor 105. A current sensor circuit 104 provides output signals to both digital gates 103 and microprocessor 105. LED indicators 106 are activated by microprocessor 105. A photo sensor 107 is periodically activated by microprocessor 105 to sample the ambient lighting conditions.

Figure 13:
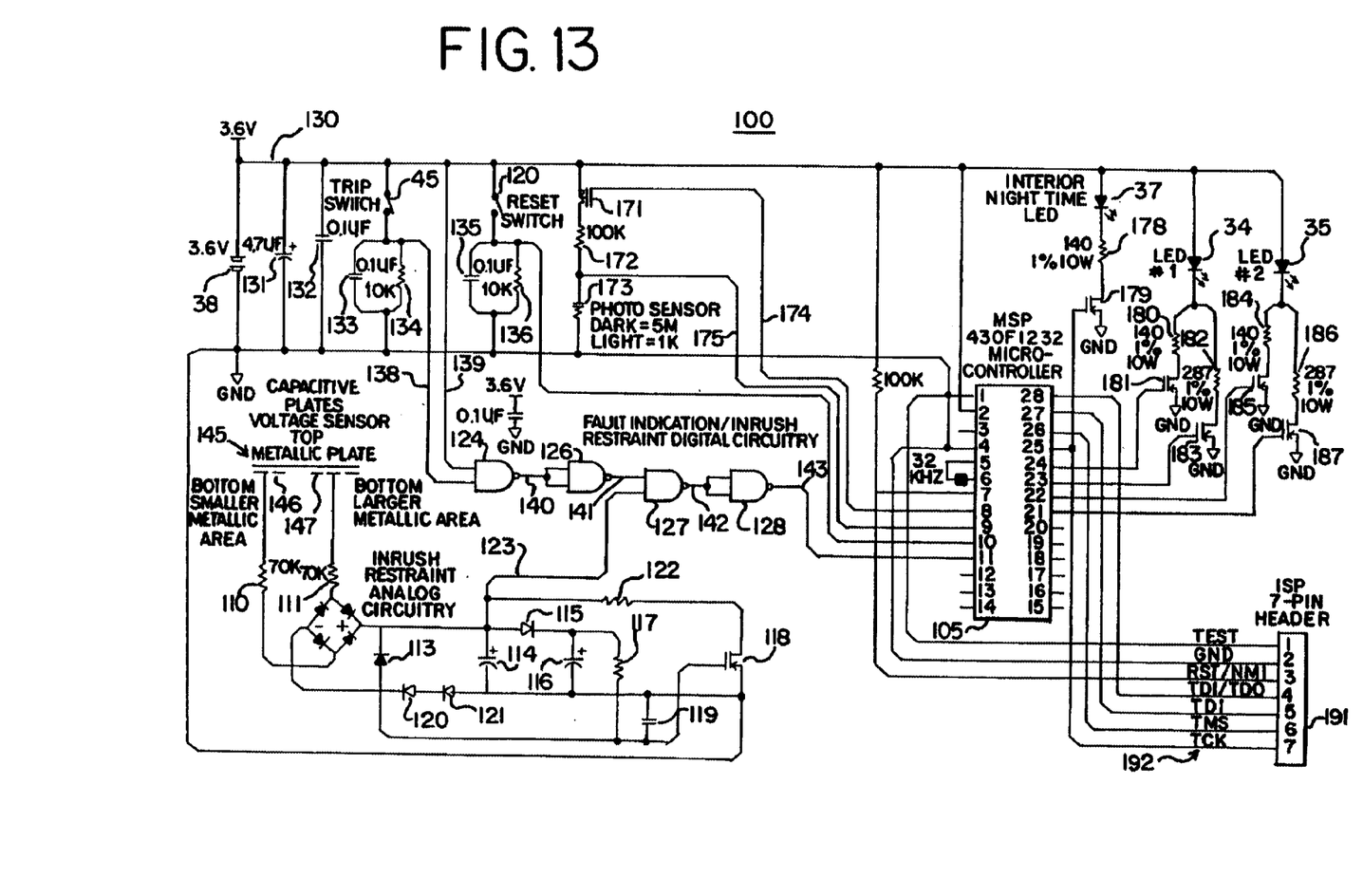
FIG. 13 is an electrical schematic diagram of the electronic circuitry for the fault indicators shown in FIGS. 1–7.

The electronic circuitry 100 for fault indicator 20 is shown in greater detail in the schematic diagram of FIG. 13. Most of circuitry 100 may be located on a circuit board 49 in housing 30 or 30a (FIGS. 3 and 6). Electrostatic sensor 145 is shown consisting of a metallic plate 50, a smaller electrode 146 and a larger electrode 147. Each of electrodes 146 and 147 is connected through a current limiting resistor 110 and 111, respectively, to a full-wave diode rectification bridge 112 to supply a DC voltage to the voltage inrush restraint circuitry. This DC voltage is also applied via line 123 to an input of NAND gate 127. A Zener diode 113 may be selected to limit the voltage from rectification bridge 112 to approximately 5 volts. A capacitor 114 quickly charges up to the input voltage. Another capacitor 116 also quickly charges up to near the input voltage through a diode 115. However, if line voltage is temporarily lost, diode 115 will prevent rapid discharge of capacitor 116 except through the slower discharge path of a resistor 117. A pair of diodes 120 and 121 operates to impress a negative bias of about 1.5 volts at the gate of an FET 118 with respect to its source to normally keep FET 118 biased off. A capacitor 119 is connected across diodes 120 and 121. The drain terminal of FET 118 connects back to the DC voltage and to line 123 to NAND gate 127 through a resistor 122. Thus, line 123 is normally held at a logic high level.

However, if a voltage inrush condition is sensed, some energy is transferred from capacitor 116 to capacitor 119, which positively biases the gate to source of FET 118. FET 118 then becomes conductive and quickly discharges capacitor 114 through resistor 122 to ground, as well as sinking any current continuing to be rectified by diode bridge 112. Capacitor 116 discharges much more slowly through resistor 117, keeping FET 118 in conduction. Line 123 to gate 127 is then kept at a logic low level.

This voltage inrush restraint circuit is effective for a wide range of applications. For example, this restraint circuit will perform effectively in a wide range of applications from 69 kilovolt lines down to 2.4 kilovolt lines.

The current sensing circuitry in FIG. 13 will now be considered. Circuitry 100 is mostly disposed on a circuit board 49 located in housing 30 or 30a (FIG. 3 or 6). A magnetic reed switch is connected between the positive supply voltage on line 130 and a resistor 134 and a capacitor 133 in parallel. As seen in FIGS. 3 and 6, magnetic reed switch 45 is positioned with its axis perpendicular to and spaced from the axis of conductor 21 to respond to fault currents in the conductor in a manner well known to the art. When normally open magnetic reed switch 45 closes upon the occurrence of a fault current, such as a current in excess of 600 A, the voltage on line 130 is supplied via line to one input of NAND gate 124. The other input of gate 124 is referenced to line 130. Thus, when both inputs to NAND gate 124 are logic highs, the output on line 140 will go low. NAND gate 126 with both of its inputs tied together operates as an inverter. Thus, upon the occurrence of a fault, line 140 will be at a logic low and line 141 will be at a logic high.

As previously described, the other input to NAND gate 127 on line 123 will also be at a logic high if there is no voltage inrush. Thus, output line 142 will be at a logic low and the output of NAND gate 128 to terminal 11 of microprocessor 105 will be at a logic high. In summary, terminal 11 of microprocessor 105 is normally at a logic low. However, if magnetic reed switch 45 closes upon sensing a fault and the inrush restraint circuit is in its normal operation with no voltage inrush, terminal 11 will switch from a logic low level to a logic high level to indicate the occurrence of a fault. This change of signal at terminal 11 will cause microprocessor 105 to come out of a sleep mode.

Figure 15:
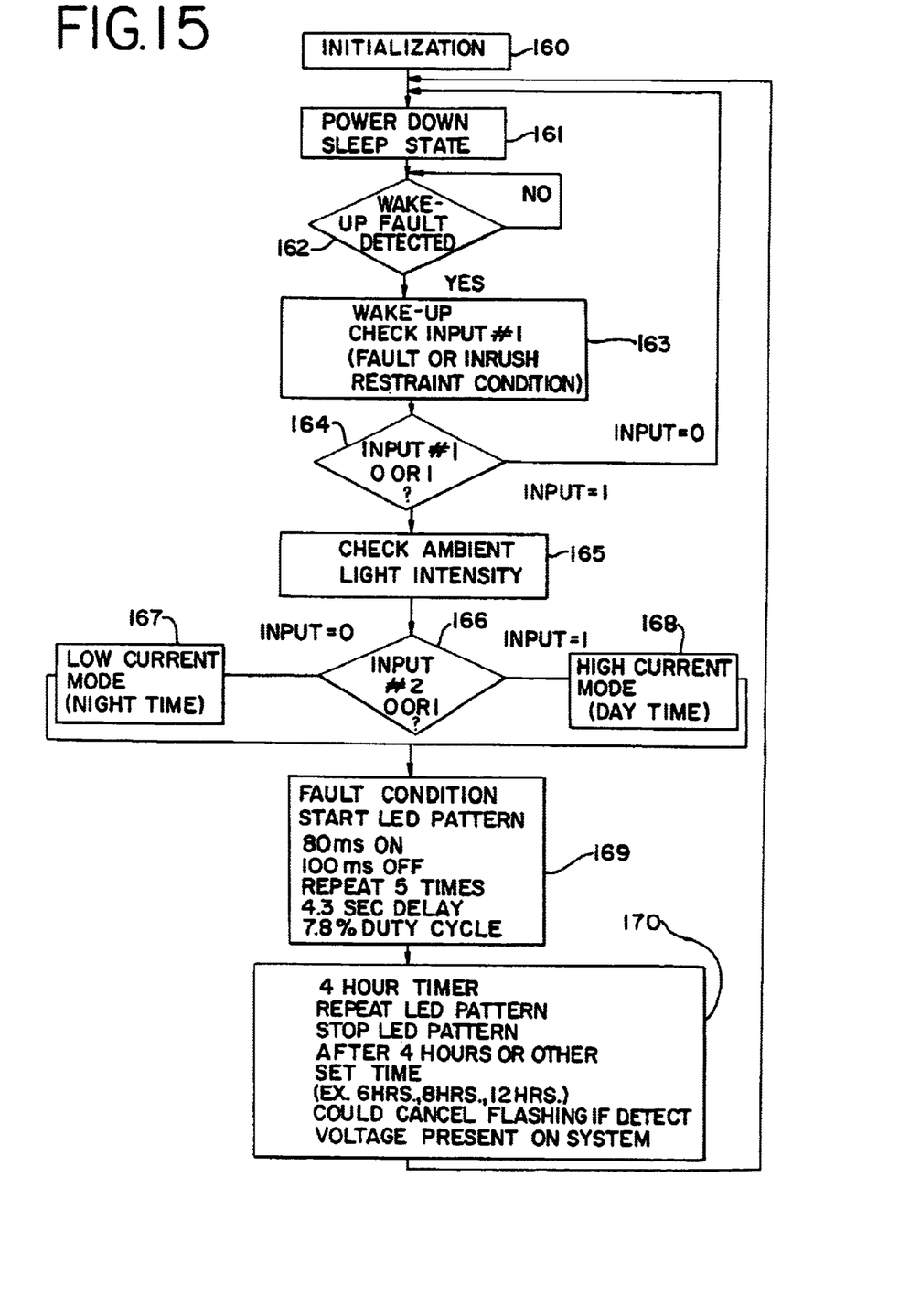
FIG. 15 is a flow chart illustrating typical steps that may be employed by a microprocessor during the various operational modes of the fault indicators illustrated in FIGS. 1–7.

Microprocessor 105 is normally in a sleep state in which it draws virtually no power from battery 38 or 38a. For example, circuitry 100, including microprocessor 105, may typically draw 10 microamperes, or less, from battery 38 or 38a when microprocessor 105 is in the sleep mode. Sleep states or modes are sometimes also referred to as a power down mode. This sleep state is represented by block 161 in the microprocessor flow chart in FIG. 15. If a fault is detected at block 162, microprocessor proceeds to check its input terminals at block 163. If a fault input is confirmed at block 164, microprocessor 105 checks the ambient light intensity at block 165.

A photo sensor 173 (FIG. 13) is connected in series with a resistor 172 and an FET 171. For example, photo sensor 173 may be a cadmium-sulfide cell or a photo-transistor. FET 171 is normally biased off by a line 174 from microprocessor terminal 8 to further conserve battery power. Once microprocessor 105 is awakened, microprocessor 105 checks the ambient light level by temporarily applying a bias on line 174 to render FET 171 conductive. Microprocessor 105 then senses the voltage across photo sensor 173. If bright light prevails, photo sensor 173 may have an impedance of about 1000 ohms. Since resistor 172 is about 100 K ohms, the voltage across photo sensor 173 and on line 175 back to microprocessor terminal 9 will be near zero. However, if the ambient light level is nearly dark, the impedance of photo sensor 173 may be about 5 M ohms. In this instance, the voltage across photo sensor 173 will be near the battery supply voltage of about 3.6 volts. Thus, microprocessor 105 can distinguish between low ambient lighting levels and high ambient lighting levels, which corresponds to decision block 166 in the flow chart of FIG. 15.

Microprocessor 105 then decides whether to operate LEDs 34 and 35 in the low current mode of nighttime, block 167, or in the high current mode of daytime, block 168. For example, microprocessor 105 may briefly sample the ambient lighting conditions about once every 15 to 30 minutes. In accordance with another feature of the present invention, indicator LEDs 34 and 35 may be operated at lower illumination intensity during lower illumination levels to further conserve battery power. For example, LEDs 34 and 35 may be supplied with a higher level of current of about 15 to 20 mA during daytime, as represented by the peak waveform 193 in FIG. 14. LEDs 34 and 35 may be supplied with a lower level of current of about 5 to 10 mA during the evening hours, as represented by the lower waveform 194 in FIG. 14. Microprocessor 105 may also be designed to provide for an intermediate level of illumination, such as about 10 to 15 mA for intermediate lighting conditions such as at dusk, dawn or on an overcast day, as represented by the intermediate waveform 195 in FIG. 14.

With reference to the schematic diagram in FIG. 13, microprocessor can activate LED 34 into the daytime and brighter illumination by biasing FET 181 to render it conductive. Resistor 180 then limits the current conducted through LED 34 to the desired or selected level for daytime illumination. Similarly, LED 35 may be activated to the brighter daytime mode by biasing FET 185 to its conductive state. Conversely, LEDs 34 and 35 can be activated into their lower current, lower brilliance, nighttime mode by biasing FETs 183 and 187, respectively, into their conductive states. As mentioned above, the activation of the nighttime mode for LEDs 34 and 35 may result in a savings of current drain from battery 38 or 38a of nearly 50 percent as compared to the daytime mode. Microprocessor 105 may begin illuminating LEDs 34, 35 and/or 37 immediately upon detection of a fault or after a predetermined delay since no service personnel are likely to immediately arrive after a fault occurs.

Figure 14:
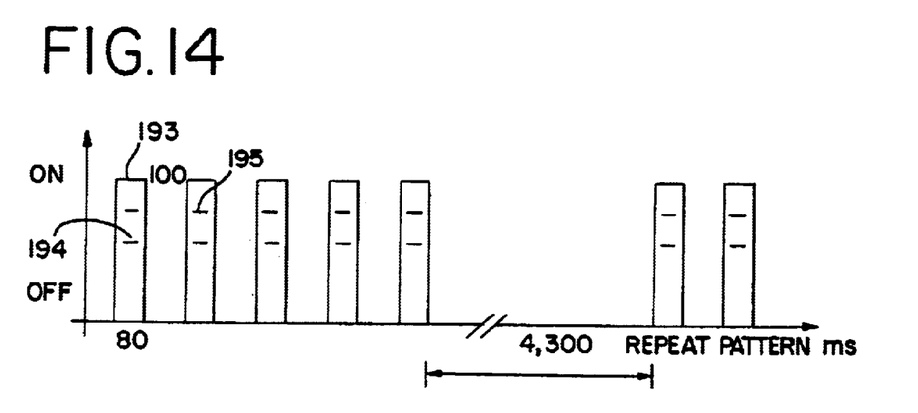
FIG. 14 is a timing diagram showing a preferred illumination pattern for the LEDs used in the fault indicators of FIGS. 1–7.

To further save on battery current drain, LEDs 34 and 35 are preferably not continuously illuminated in either the daytime or nighttime modes. Instead, as shown in FIG. 14, LEDs 34 and 35 are preferably pulsed on for a short period of time, such as about 500 to 900 milliseconds (ms), with power being enabled to the LEDs only intermittently during the pulses. These pulses are then followed by an off time of about 4 seconds when preferably no further pulses appear. However the range of off time may be about 2 to 10 seconds. Preferably, this PWM pattern of pulses may be repeated about every 4 to 6 seconds. This provides the eye-catching illumination characteristic desired to call attention to a fault occurrence while further limiting current drain and conserving battery life. In the example of FIG. 14, LEDs 34 and 35 are turned on for about 80 ms and turned off for about 100 ms for five times, resulting in about 900 ms of intermittent illumination. This pattern is again repeated after an off time of about 4.3 seconds. The duty cycle of LEDs 34 and 35 under this example is thus about 7.8 percent. This example of powering LEDs 34 and 35 is also shown in block 169 of the microprocessor flow chart in FIG. 15. Of course, many variations will be apparent to those skilled in the art with respect to the on/off times, such as pulsing LEDs 34 and 35 on for about three times instead of the illustrated five times, altering the various time periods, and the like.

The previously described nighttime LED 37 disposed in the interior of housing 30 or 30a may be actuated by biasing FET 179 into its conductive state, such as when microprocessor 105 determines from photo sensor 173 that the ambient lighting is low. When LED 37 is continuously powered, housing 30 will have a glowing effect. However, if LED 37 is intermittently powered, as described above for LEDs 34 and 35, and in the timing diagram of FIG. 14, housing 30 will provide a flashing effect.

A connector 191 has a plurality of conductors to microprocessor 105 and to other portions of circuitry 100 to enable programming of microprocessor 105.

As explained above in connection with FIG. 11, fault indicator 20 preferably has a timed reset to assist in following the path of a fault along power distribution lines. This is illustrated in block 170 of the flow chart in FIG. 15. If any fault indicator resets upon termination of the fault, information about the location of temporary faults would be lost before service personnel arrived to investigate. Accordingly, once a fault is detected, fault indicator 20 continues to display the fault condition, such as by LEDs 34 and 35 and/or LED 37 for a predetermined amount of time such as from 1 to 24 hours, and preferably about 4 hours. After the predetermined time, fault indicator 20 will automatically reset itself including termination of illumination of any LEDs 34, 35 and/or 37, termination of sampling of photo sensor 173 and microprocessor 105 will resume its sleep mode.

A reset switch 120 has an input to terminal 10 of microprocessor 105 for manually resetting the fault indicator with a magnetic tool at any time. If fault indicator 20 is manually reset, any LEDs 34, 35 and 37 will be deactivated and microprocessor 105 will return to its sleep mode. Microprocessor 105 is commercially available from Texas Instruments of Dallas, Tex. under part number MSP430F1232. Other commonly available microprocessors or microcontrollers may be used in place of this microprocessor.

Due to the typical outdoor environmental conditions that the fault indicators 20 are subjected to when installed on the conductors of a power distribution system, 10 years is about the expected lifetime of these fault indicators. Advances in the state of the technology can also be expected to obsolete fault indicators in about 10 years. Thus, the low current drain of circuitry 100 in combination with the high capacity of battery 38a provides a fault indicator 20 in which the battery can be realistically expected to last the lifetime of the fault indicator, without any needed of required replacement of the battery during the fault indicator's operative lifetime.

While particular embodiments of the invention have been shown and described, it will be obvious to those skilled in the art that changes and modifications may be made therein without departing from the invention in its broader aspects.

What is claimed is:

1. A fault indicator for indicating the occurrence of a fault in an electrical conductor, comprising:
   a housing;
   a battery;
   a fault sensor for sensing the occurrence of a fault on said electrical conductor;
   at least one light emitting diode operable from said battery and viewable from the exterior of the housing;
   a light sensor for sensing the ambient light level, and
   a microprocessor in communication with said fault sensor to determine when a fault has occurred on said electrical conductor, in communication with said light sensor to determine the ambient light level, to enable the supply of power from said battery to said at least one light emitting diode upon determining that a fault has occurred, to cease enabling power from said battery to said at least one light emitting diode at a predetermined time after determining that a fault occurred and to reset said fault indicator around said predetermined time;
   said microprocessor responding to a lower ambient light level by reducing the power supplied to said at least one light emitting diode during lower ambient light levels, thereby conserving battery power.

2. The fault indicator as defined in claim 1 wherein said at least one light emitting diode comprises two light emitting diodes.

3. The fault indicator as defined in claim 1 wherein said microprocessor enables power from said battery to be provided to said at least one light emitting diode by means of pulse width modulation signals to further conserve battery power.

4. The fault indicator as defined in claim 3 wherein said pulse width modulation signals comprise a series of pulses which enable power to be provided from said battery to said at least one light emitting diode, followed by a longer off time in which power is disabled from being provided to said at least one light emitting diode.

5. The fault indicator as defined in claim 4 wherein the series of pulses in said pulse width modulation signals number in the range of three to five pulses.

6. The fault indicator as defined in claim 4 wherein the series of pulses in said pulse width modulation signals enable power to be provided to said at least one light emitting diode for about one second followed by an off time in which no further series of pulses occur for a few to several seconds.

7. The fault indicator as defined in claim 1 wherein said microprocessor is normally in a sleep mode, said microprocessor is awakened upon said fault sensor sensing a fault, and said microprocessor returns to the sleep mode after resetting the fault indicator.

8. The fault indicator as defined in claim 1 wherein said microprocessor determines an intermediate ambient light level between the ambient light level normally encountered during the daytime and the lower light level normally encountered during the nighttime, said microprocessor responsive to the intermediate ambient light level to control the amount of power supplied to said at least one light emitting diode to an intermediate level.

9. The fault indicator as defined in claim 1 wherein said predetermined time after determining that a fault has occurred is in the range of 1 to 24 hours.

10. A fault indicator for indicating the occurrence of a fault in an electrical conductor, comprising:
    a housing;
    a battery;
    a fault sensor for sensing the occurrence of a fault on said electrical conductor;
    at least one indicator capable of being illuminated by power from said battery and viewable from the exterior of the housing;
    a light sensor for sensing the ambient light level; and
    a microprocessor in communication with said fault sensor to determine when a fault has occurred on said electrical conductor, in communication with said light sensor to determine the ambient light level, to enable power from said battery to said at least one indicator upon determining that a fault has occurred, to cease enabling power from said battery to said at least one indicator at a predetermined time after determining that a fault occurred and to reset said fault indicator around the predetermined time after determining that a fault occurred;
    said microprocessor responding a lower ambient light level by reducing the power supplied to said at least one indicator during lower ambient light levels, thereby conserving battery power.

11. The fault indicator as defined in claim 10 wherein said microprocessor enables power from said battery to be provided to said at least one indicator by means of pulse width modulation signals to further conserve battery power.

12. The fault indicator as defined in claim 11 wherein said pulse width modulation signals comprise a series of pulses which enable power to be provided from said battery to said at least one indicator, followed by a longer off time in which power is disabled from being provided to said at least one indicator.

13. The fault indicator as defined in claim 12 wherein the series of pulses in said pulse width modulation signals number in the range of three to five pulses.

14. The fault indicator as defined in claim 12 wherein the series of pulses in said pulse width modulation signals enable power to be provided to said at least one indicator for about one second followed by an off time in which no further series of pulses occur for about 2 to 10 seconds.

15. The fault indicator as defined in claim 10 wherein said microprocessor is normally in a sleep mode, said microprocessor is awakened upon said fault sensor sensing a fault, and said microprocessor returns to the sleep mode after resetting the fault indicator.

16. The fault indicator as defined in claim 10 wherein said microprocessor determines an intermediate ambient light level between the ambient light level normally encountered during the daytime and the lower light level normally encountered during the nighttime, said microprocessor responsive to the intermediate ambient light level to control the amount of power supplied to said at least one indicator to an intermediate level.

17. The fault indicator as defined in claim 10 wherein said predetermined time after determining that a fault has occurred is in the range of 1 to 24 hours.

* * * * *